United States Patent [19]
Kimura et al.

[11] Patent Number: 5,146,120
[45] Date of Patent: Sep. 8, 1992

[54] LOW-NOISE OUTPUT BUFFER CIRCUIT

[75] Inventors: Masahiro Kimura; Kenji Matsuo; Ikuo Tsuchiya, all of Yokohama; Masayo Fukuda, Kanagawa, all of Japan

[73] Assignee: Kabushiki Kaisha Toshiba, Kawasaki, Japan

[21] Appl. No.: 735,951

[22] Filed: Jul. 25, 1991

[30] Foreign Application Priority Data

Jul. 31, 1990 [JP] Japan .................. 2-203564

[51] Int. Cl.$^5$ .............................................. H03K 5/00
[52] U.S. Cl. .................................. 307/570; 307/572
[58] Field of Search ............. 307/570, 572, 263, 253

[56] References Cited

U.S. PATENT DOCUMENTS

| | | | |
|---|---|---|---|
| 4,547,686 | 10/1985 | Chen | 307/572 X |
| 4,791,321 | 12/1988 | Tanaka et al. | 307/451 |
| 4,877,975 | 10/1989 | Ueno | 307/263 X |
| 5,059,824 | 10/1991 | Ueno | 307/570 X |

FOREIGN PATENT DOCUMENTS 0344614 12/1989 European Pat. Off. .

OTHER PUBLICATIONS

Report of The 1990 IEICE Spring Conference, vol. 5, pp. 5-189 C-625 "Proposition of Base-Biased BiCMOS for Low Voltage Operation".
Patent Abstract of Japan, vol. 13, No. 268 (E-755) (3616) Jun. 20, 1989.
D. M. Taub, "IBM Technical Disclosure Bulletin", vol. 8, No. 1, Jun. 1965.

*Primary Examiner*—Robert J. Pascal
*Attorney, Agent, or Firm*—Finnegan, Henderson, Farabow, Garrett and Dunner

[57] ABSTRACT

A low-noise output buffer circuit of this invention comprises a P-channel MOSFET having a source connected to a power source potential, for outputting the power source potential according to a first input signal, an N-channel MOSFET having a source connected to a ground potential, for outputting the ground potential according to a second input signal, a bipolar transistor having a collector connected to the power source potential, an emitter connected to an output terminal and a base connected to the drain of the P-channel MOSFET, and a diode having a cathode connected to the drain of the N-channel MOSFET and an anode connected to the base of the NPN bipolar transistor.

13 Claims, 8 Drawing Sheets

PRIOR ART

F I G. 1

PRIOR ART

F I G. 2

PRIOR ART

LOW-NOISE OUTPUT BUFFER CIRCUIT

BACKGROUND OF THE INVENTION

1. Field of the Invention

This invention relates to the improvement of a Bi-CMOS output buffer circuit which is particularly required to have a large current driving ability and high operation speed.

2. Description of the Related Art

Figure 1:
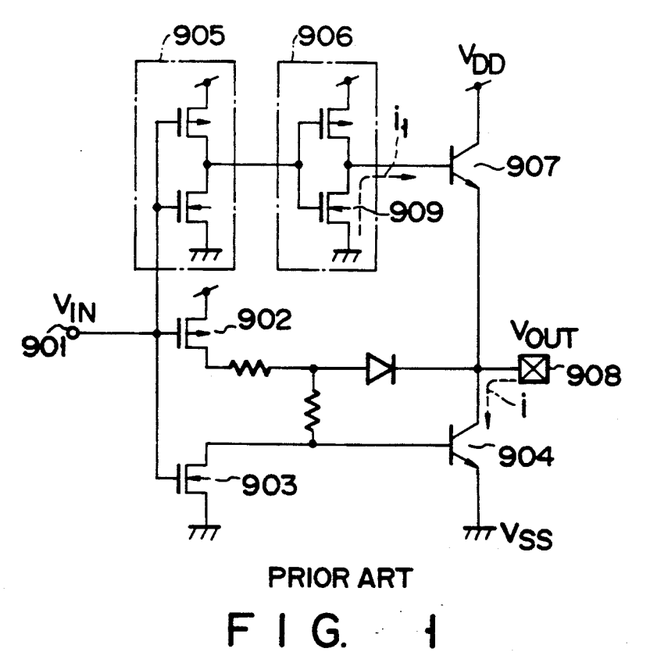
FIG. 1 is a circuit diagram showing a conventional output buffer circuit.

Conventionally, a circuit shown in FIG. 1, for example, is known as a Bi-CMOS output buffer circuit which is required to have a large current driving ability and high operation speed.

The operation of the above circuit is described below. First, assume that an input signal is applied to an input terminal 901. In this case, a P-channel MOSFET 902 is set in the OFF state and an N-channel MOSFET 903 is set in the ON state. Therefore, the base potential of an NPN bipolar transistor 904 is substantially set to an "L (GND)" level, thereby turning off the transistor 904. The voltage $V_{IN}$ of "H" level applied to the input terminal 901 is applied to an inverter 905. That is, a non-inverted signal (in this case, a voltage of "H" level) of the input signal $V_{IN}$ is applied to the base of a transistor 907. As a result, the transistor 907 is turned on, thus causing an output voltage $V_{OUT}$ of "H" level to be output from an output terminal 908.

Next, assume that a voltage $V_{IN}$ of "L (low)" level is applied to the input terminal 901. In this case, a voltage of "L" level is applied to the base of the transistor 907 to turn off the transistor 907. At this time, the P-channel MOSFET 902 is set in the ON state and the N-channel MOSFET 903 is set in the OFF state. Therefore, the base potential of the transistor 904 rises to turn on the transistor 904, thereby causing an output potential $V_{OUT}$ of "L" level to be output from the output terminal 908.

In the above output buffer circuit, an N-channel MOSFET 909 of the inverter 906 is turned on when the input signal $V_{IN}$ is changed from the "H" level (for example, 5 V) to the "L" level (for example, 0 V). As a result, the base potential of the transistor 907 is set to substantially 0 V and the transistor 907 is turned off. At this time, since the P-channel MOSFET 902 is set into the ON state, the base potential of the transistor 904 rises and a current flows into the base thereof. Therefore, the transistor 904 is turned on so that the output potential $V_{OUT}$ of the output terminal 908 may be changed from the "H" level to the "L" level.

Figure 2:
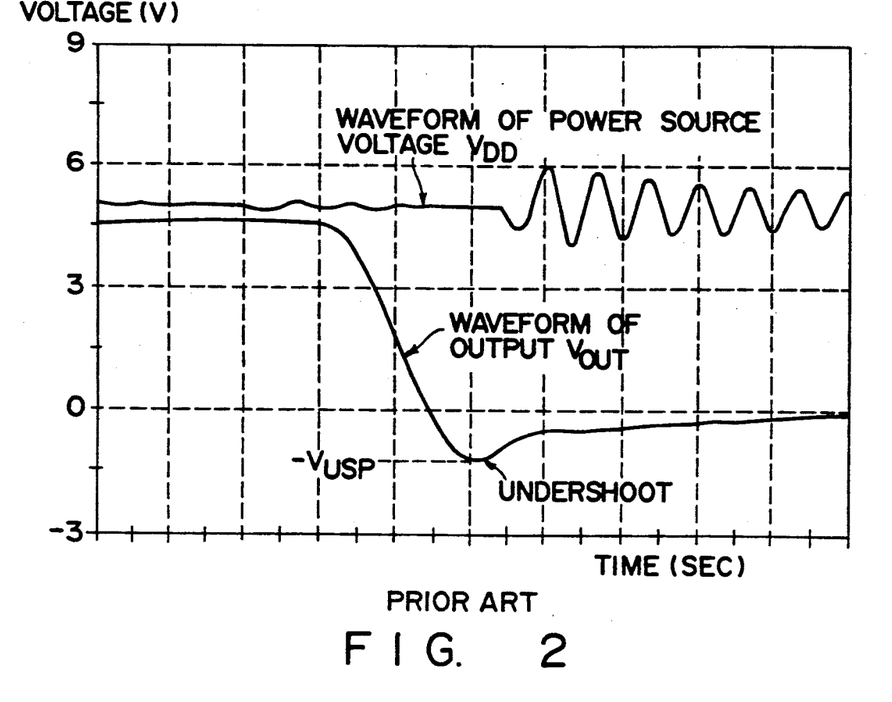
FIG. 2 is a diagram showing the relation between the power source voltage $V_{DD}$ waveform and output $V_{OUT}$ waveform of a conventional output buffer circuit.

However, as shown in FIG. 2, a phenomenon called "undershoot" is caused by the flow of a transition current i and the presence of parasitic inductance $L_P$ of a bonding wire or the like in the above output buffer circuit. The phenomenon is a well-known phenomenon that the output potential $V_{OUT}$ is temporarily set to be negative (below the GND level) and can be expressed by an equation of $L_P \times di/dt$.

The undershoot causes the value of the output potential $V_{OUT}$ to be lower than $-V_F$. As a result, the base potential of the transistor 907 is set to a value obtained by adding the peak value ($-V_{USP}$) of the undershoot to the threshold voltage $V_F$ of the transistor 907, that is, a value equal to or lower than 0 V.

Therefore, as shown in FIG. 1, a potential difference occurs between the source and drain of the N-channel MOSFET 909 of the inverter 906 and a current $i_l$ flows into the base of the transistor 907 from $V_{SS}$ (GND level). As a result, the transistor 907 which must be kept in the OFF state will be set into the ON state, thereby causing a large collector current to flow in the transistor 907.

Figure 3:
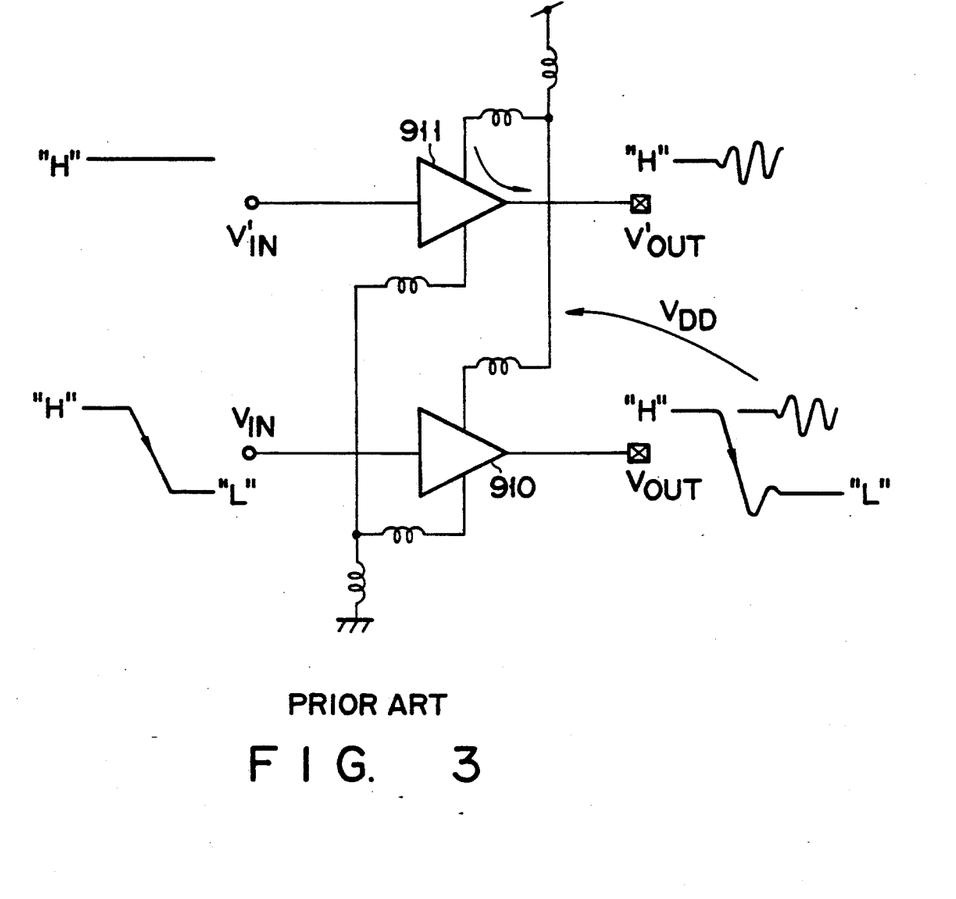
FIG. 3 is a circuit diagram showing the relation between variation in a logic output $V'_{OUT}$ waveform and variation in the power source potential caused by the conventional undershoot phenomenon.

Therefore, as shown in FIG. 3, the power source voltage $V_{DD}$ becomes unstable or fluctuates because of the flow of a collector current and the presence of the inductance ($L_P$) component of the power source $V_{DD}$ line. In this case, a plurality of logic circuits such as the above output buffer circuit are contained in the LSI, and in general, the logic circuits are commonly connected to the power source $V_{DD}$. Therefore, the output voltage $V'_{OUT}$ of a logic circuit 911 which is arranged near the above output buffer circuit 910 may fluctuate. The degree of fluctuation in the output voltage $V'_{OUT}$ may exceed the circuit threshold voltage of the next-stage logic circuit connected to the logic circuit 911, and in this case, the next-stage logic circuit may be erroneously operated.

SUMMARY OF THE INVENTION

This invention has been made to solve the above problem, and an object of this invention is to provide an output buffer circuit which can be made highly reliable by preventing a large current (through current) caused by the undershoot from flowing from the power source so as to prevent fluctuation in the power source potential.

In order to attain the above object, a low-noise output buffer circuit of this invention comprises a first element connected to a power source potential, for outputting the power source potential according to a first input signal; a second element connected to a ground potential, for outputting the ground potential according to a second input signal; a bipolar transistor having a collector connected to the power source potential, an emitter connected to an output terminal and a base connected to the first element; and a diode having a cathode connected to the second element and an anode connected to the base of the bipolar transistor.

Further, a low-noise output buffer circuit of this invention comprises a first element connected to a power source potential, for outputting the power source potential according to a first input signal; a second element for outputting a ground potential according to a second input signal; a bipolar transistor having a collector connected to the power source potential, an emitter connected to an output terminal and a base connected to the first and second elements; and a diode having a cathode connected to the ground potential and an anode connected to the second element.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

There will now be described an embodiment of this invention with reference to the accompanying drawings. In this description, common portions in all of the drawings are denoted by the same reference numerals so as to omit the redundant explanation thereof.

Figure 4:
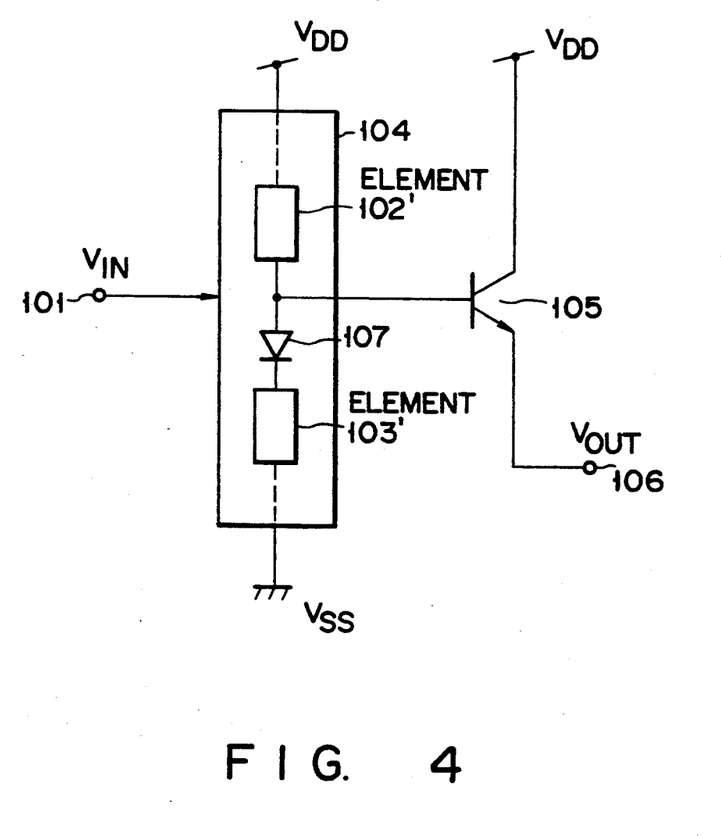
FIG. 4 is a circuit diagram showing the basic construction of an output buffer circuit according to a first embodiment of this invention.

FIG. 4 is a circuit diagram showing the basic construction of an output buffer circuit according to a first embodiment of this invention. In this case, 101 denotes an input terminal, 102' an element such as a P-channel MOSFET for outputting an "H" level potential (power source $V_{DD}$ potential), 103' an element such as an N-channel MOSFET for outputting an "L" level potential (ground $V_{SS}$ potential), 104 a logic circuit, for example, an inverter, 105 an NPN bipolar transistor connected to receive an output potential of the logic circuit 104 at the base thereof, 106 an output terminal, and 107 a diode.

In the output buffer circuit of this invention, the diode 107 is connected between the bipolar transistor 105 and the element 103' for outputting an "L" level potential (ground $V_{SS}$ potential). The cathode and anode of the diode 107 are respectively connected to the element 103' and the base of the bipolar transistor 105. With this connection, a phenomenon that the bipolar transistor 105 is turned on by the undershoot can be prevented.

Figure 5:
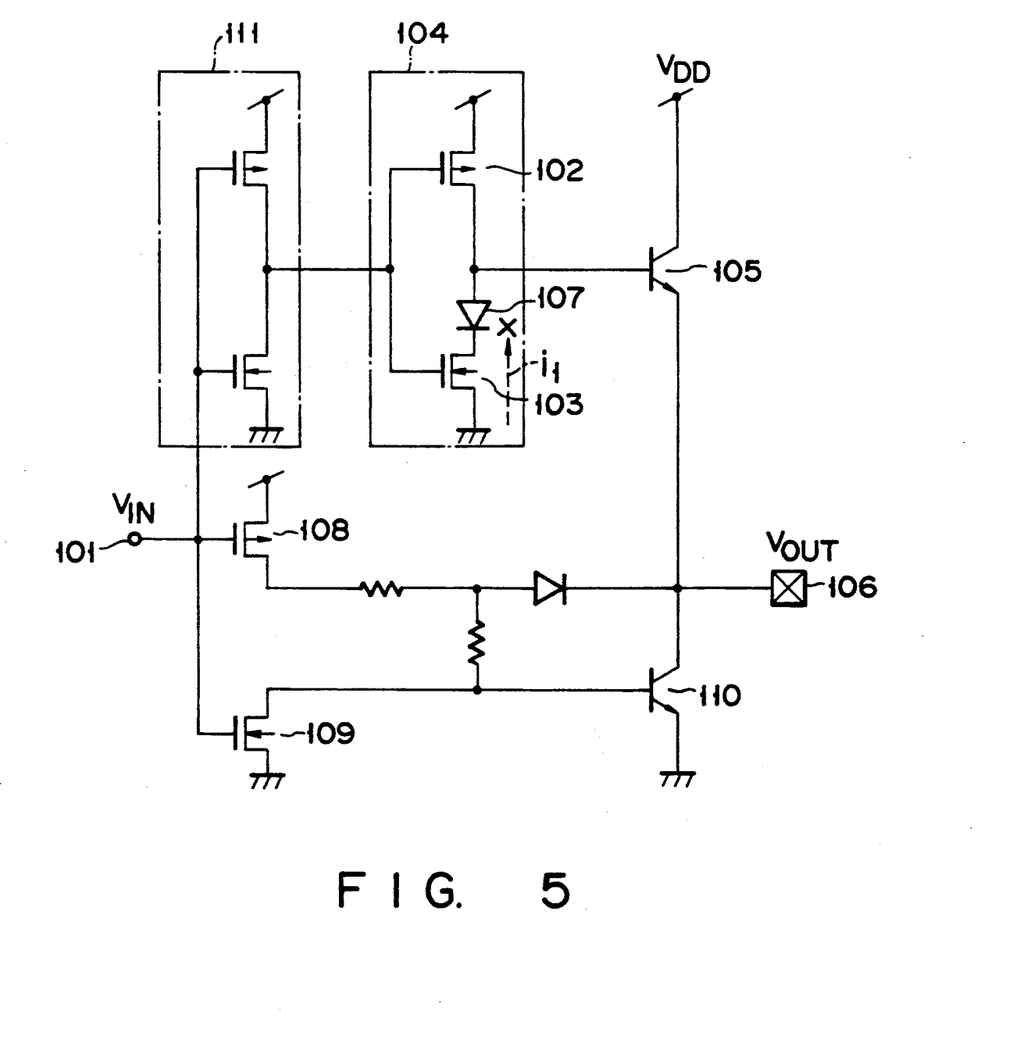
FIG. 5 is a circuit diagram showing the output buffer circuit of FIG. 4 more in detail.

FIG. 5 is a circuit diagram more concretely showing the above output buffer circuit according to the first embodiment. In this case, 102 and 108 denote P-channel MOSFETs, 103 and 109 denote N-channel MOSFETs, 110 denotes an NPN bipolar transistor, and 111 denotes an inverter.

Figure 6:
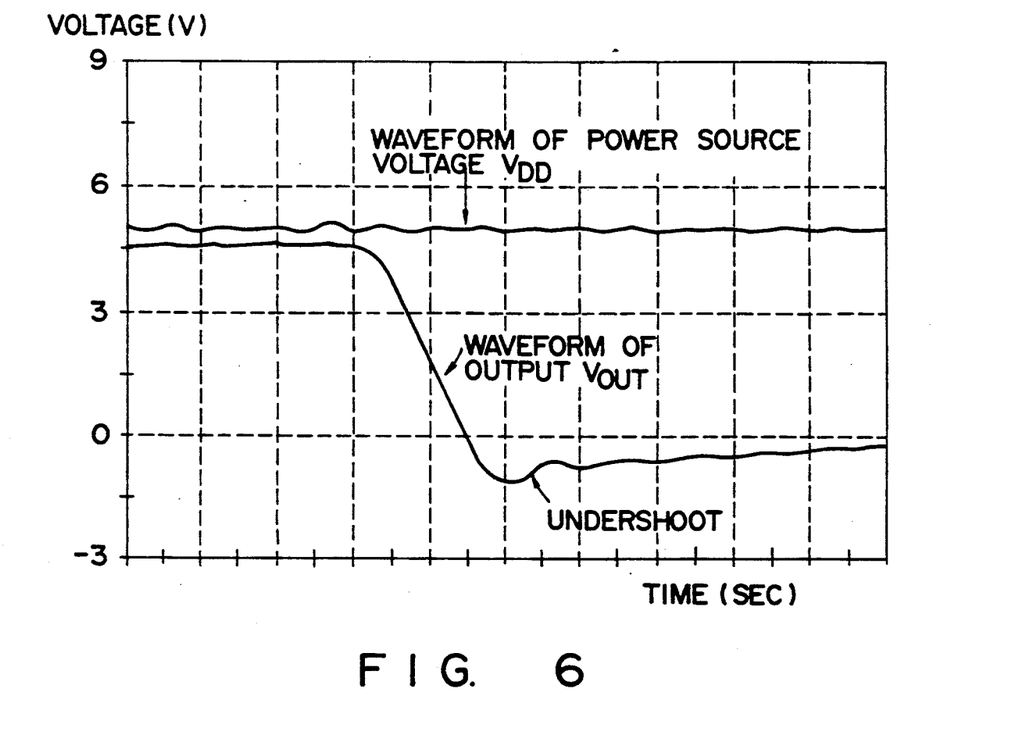
FIG. 6 is a diagram showing the relation between the power source voltage $V_{DD}$ waveform and output $V_{OUT}$ waveform of an output buffer circuit of this invention.

The operation of the above circuit is concretely explained below. First, assume that the potential $V_{OUT}$ of the output terminal 106 is changed from the "H" level to the "L" level. In this case, the undershoot as is shown in FIG. 6 occurs in the output potential $V_{OUT}$ by a transition current flowing in the bipolar transistor 110 and the inductance component ($L_P$) of the wiring and the like. As a result, if the threshold voltage of the bipolar transistor 105 is set to $-V_F$ the output potential $V_{OUT}$ may be sometimes set equal to or less than $-V_F$. When the output potential $V_{OUT}$ becomes equal to or less than $-V_F$, the base potential of the bipolar transistor 105 becomes negative so that a potential difference occurs between the base of the bipolar transistor 105 and the source (ground potential) of the N-channel MOSFET 103. The operation explained so far is the same as that of the conventional case.

Figure 7:
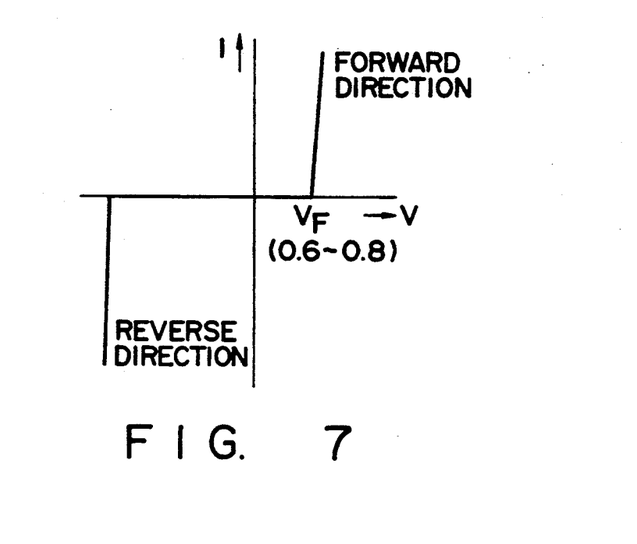
FIG. 7 is a diagram showing the diode characteristic.

However, in this invention, the diode 107 is connected between the drain of the N-channel MOSFET 103 and the base of the bipolar transistor 105. In order to utilize the reverse current characteristic shown in FIG. 7, the cathode of the diode 107 is connected to the drain of the N-channel MOSFET 103 and the anode thereof is connected to the base of the bipolar transistor 105. With this connection, a current $i_f$ caused by the undershoot can be interrupted.

With the above construction, the current $i_f$ caused by the undershoot can be interrupted by the presence of the diode 107. Therefore, a current required for turning on the bipolar transistor 105 will not be supplied to the base of the bipolar transistor 105. That is, the bipolar transistor 105 can be prevented from being unwantedly turned on. As shown in FIG. 6, since fluctuation in the power source voltage $V_{DD}$ can be suppressed and fluctuation in the logic output potential at a portion near the output buffer circuit can be suppressed, a highly reliable logic operation can be attained. In this case, a potential difference occurring between the ground potential $V_{SS}$ and the base of the bipolar transistor 105 is small enough to be negligible when compared with the breakdown voltage in the reverse direction of the diode 107.

Figure 8:
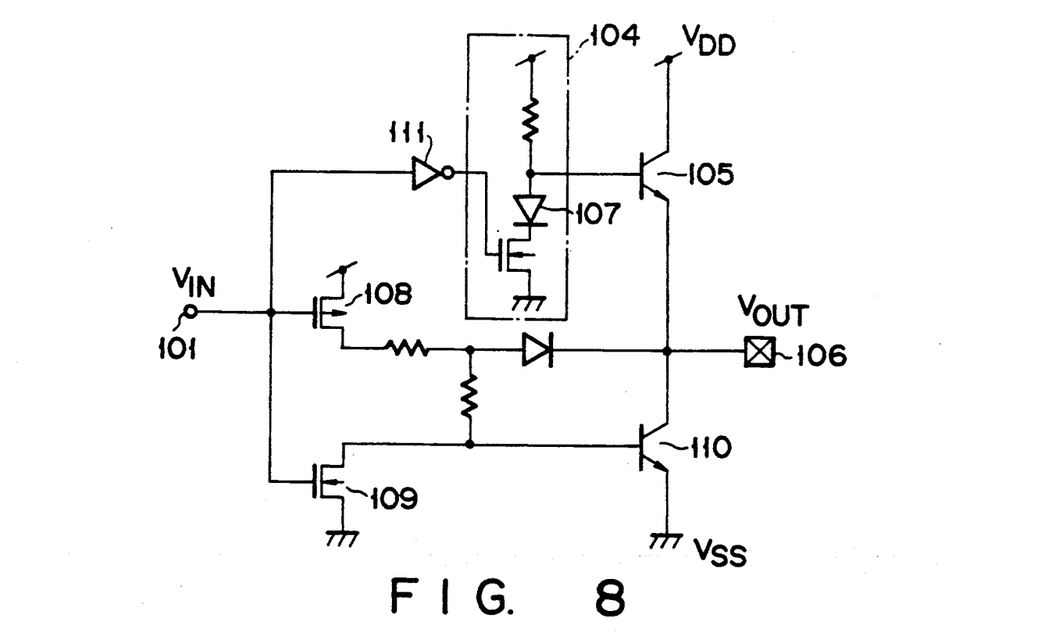
FIG. 8 to 10 are circuit diagrams showing modifications of the output buffer circuit of FIG. 5.
Figure 9:
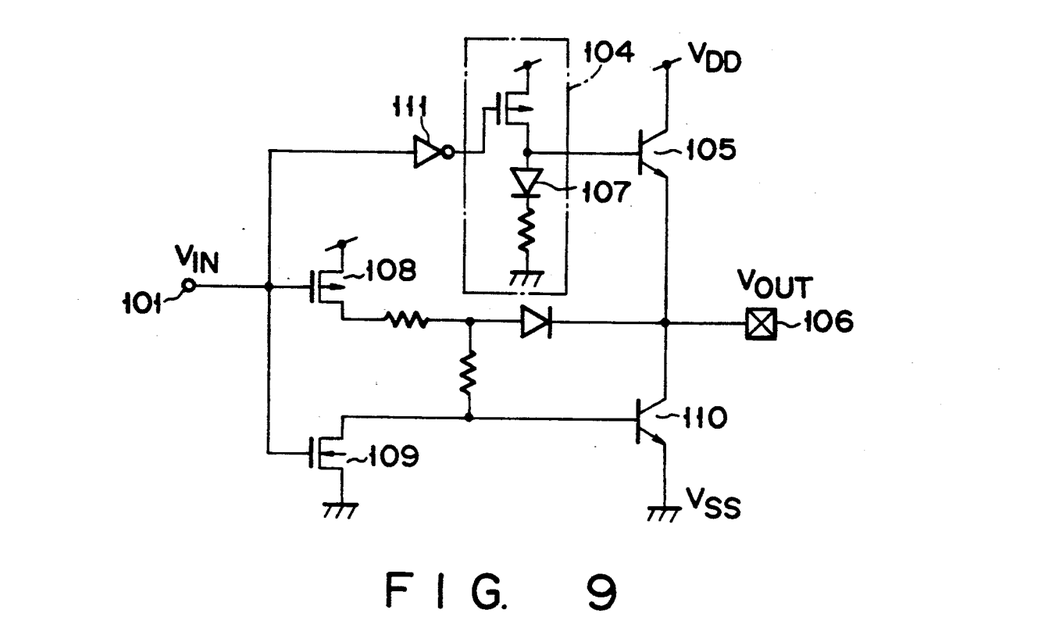
Figure 10:
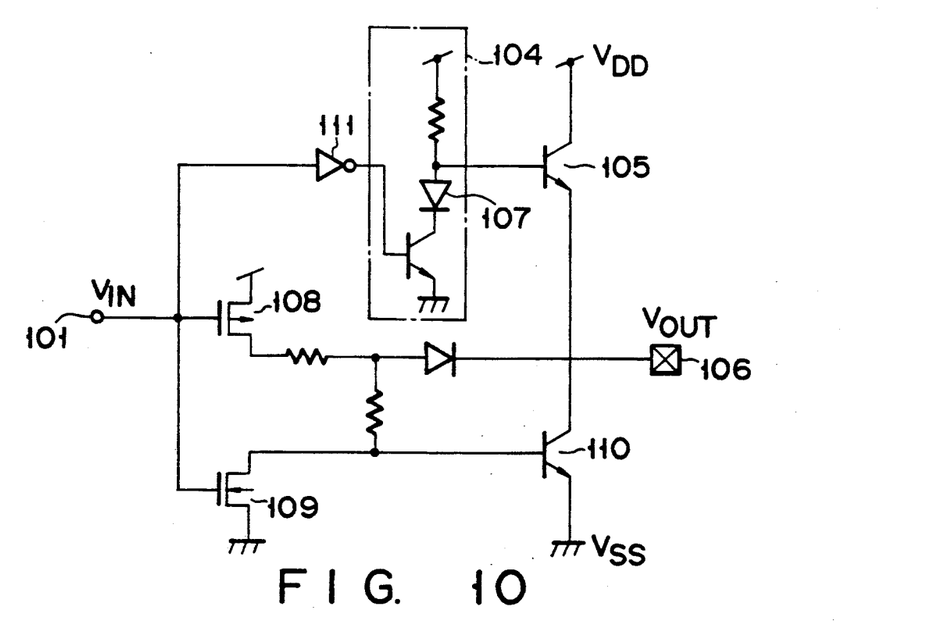

FIGS. 8 to 10 respectively show the modifications of the first embodiment.

In the modification shown in FIG. 8, a resistor is used instead of the P-channel MOSFET of the inverter 104 of FIG. 5. Further, in the modification shown in FIG. 9, a resistor is used instead of the N-channel MOSFET of the inverter 104 of FIG. 5. Further, in the modification shown in FIG. 10, an NPN bipolar transistor is used instead of the N-channel MOSFET of the inverter 104 of FIG. 5.

Also, in the above modifications, the same effect as that of the first embodiment can be obtained.

Figure 11:
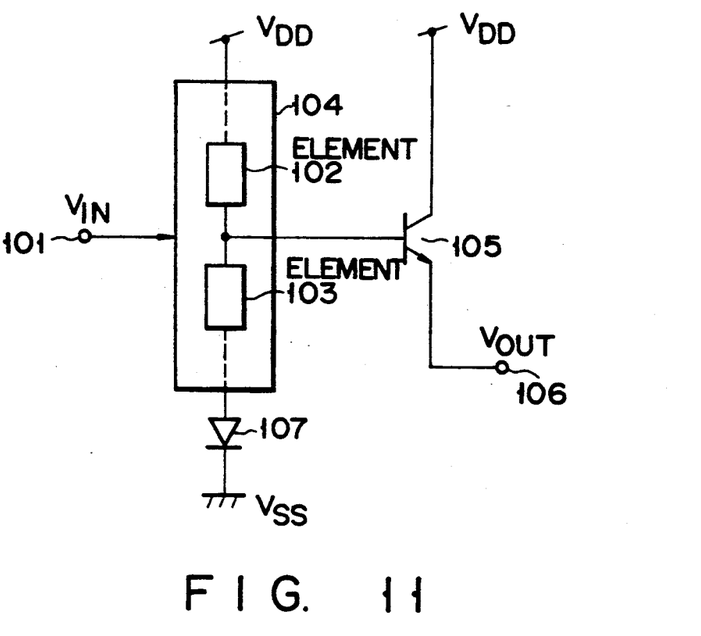
FIG. 11 is a circuit diagram showing the basic construction of an output buffer circuit according to a second embodiment of this invention.

FIG. 11 shows the basic construction of an output buffer circuit according to a second embodiment of this invention.

In the output buffer circuit of this embodiment, a diode 107 is connected between a logic circuit 104 and a ground $V_{SS}$ potential. The cathode of the diode 107 is connected to the ground $V_{SS}$ potential and the anode thereof is connected to the logic circuit 104. With the above construction, a current caused by the undershoot can be interrupted and the bipolar transistor 105 can be prevented from being turned on. The logic circuit 104 outputs an output signal (power source $V_{DD}$ potential) of "H" level or an output signal (ground $V_{SS}$ potential) of "L" level according to an input signal.

Figure 12:
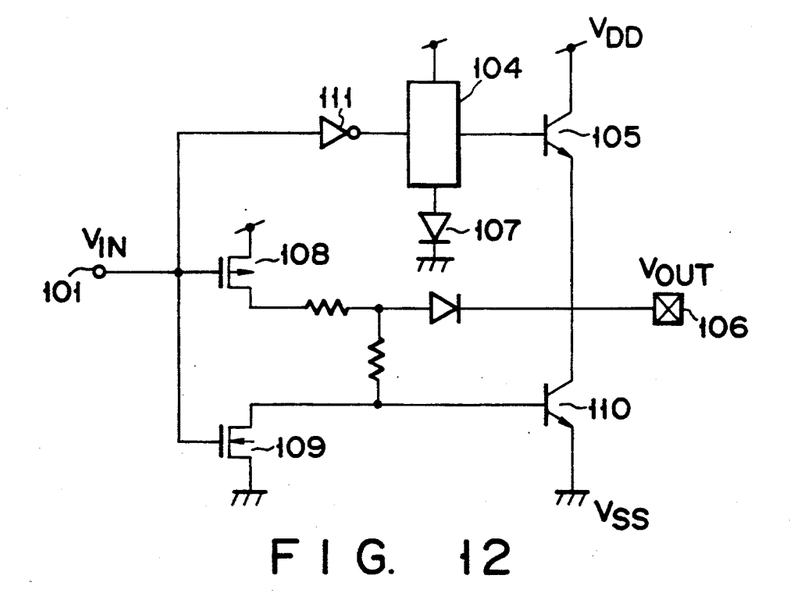
FIG. 12 is a circuit diagram showing the output buffer circuit of FIG. 11 more in detail.

FIG. 12 is a circuit diagram concretely showing the output buffer circuit of FIG. 11. The operation of the above circuit is the same as that of the output buffer circuit of FIG. 5.

Thus, even when a diode is provided outside the logic circuit, the same effect as that obtained in the first embodiment can be attained. Further, the logic circuit 104 may be formed of the inverter with the construction shown in FIGS. 8 to 10 as well as the inverter with the construction shown in FIG. 5.

Figure 13:
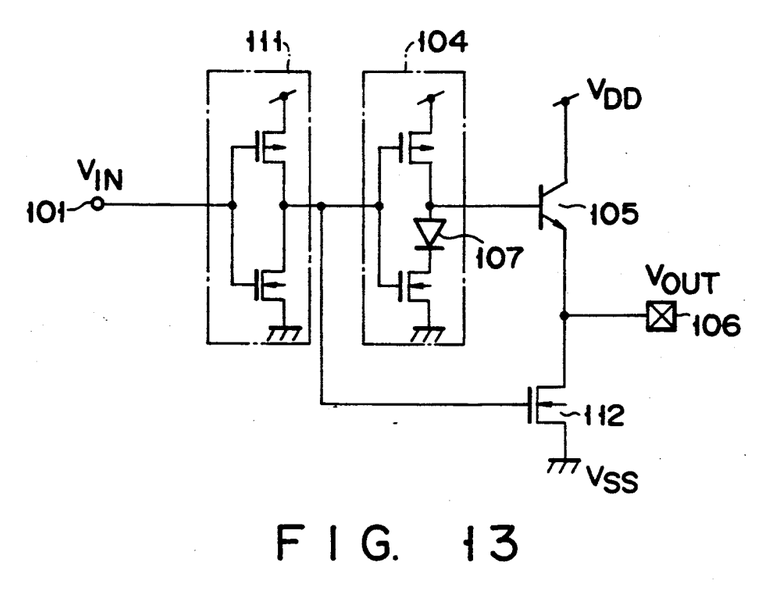
FIG. 13 is a circuit diagram showing an output buffer circuit according to a third embodiment of this invention.

FIG. 13 shows an output buffer circuit according to a third embodiment of this invention.

In this embodiment, an N-channel MOSFET 112 is used as an element for outputting an "L" level voltage. In this case, the base of the N-channel MOSFET 112 is connected to the output terminal of an inverter 111 and therefore the circuit construction can be made extremely simple.

In the above first to third embodiments, the diode 107 having a PN junction is used as an element for interrupting a current path i/caused by the undershoot phenomenon, but a Schottky diode may be used instead of the above diode, for example.

Further, the source of the N-channel MOSFET 103 in the logic circuit 104 is preferably set at the ground potential, and it is not preferable to set the source of the N-channel MOSFET higher than the ground potential.

The logic circuit 104 is not limited to an inverter; it can be a NAND gate or a NOR gate.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A low-noise output buffer circuit comprising:
   a first MOSFET having a source connected to a power source potential, a gate for receiving a first input signal and a second input signal, and a drain, said first MOSFET for outputting the power source potential according to said first input signal;
   a second MOSFET having a source connected to a ground potential, a gate for receiving said first input signal and said second input signal, and a drain, said second MOSFET for outputting the ground potential according to said second input signal;
   a bipolar transistor having a collector connected to said power source potential, an emitter connected to an output terminal and a base connected to the drain of said first MOSFET; and
   a diode having a cathode connected to the drain of said second MOSFET and an anode connected to the base of said bipolar transistor.

2. A low-noise output buffer circuit according to claim 1, wherein said diode is a Schottky diode.

3. A low-noise output buffer circuit comprising:
   a first element connected to a power source potential, for outputting the power source potential according to a first input signal;
   a second element for outputting a ground potential according to a second input signal;
   a bipolar transistor having a collector connected to said power source potential, an emitter connected to an output terminal and a base connected to the first and second elements; and
   a diode having a cathode connected to said ground potential and an anode connected to said second element.

4. A low-noise output buffer circuit according to claim 3, wherein said first element is a P-channel MOSFET.

5. A low-noise output buffer circuit according to claim 3, wherein said first element is a resistor.

6. A low-noise output buffer circuit according to claim 3, wherein said second element is an N-channel MOSFET.

7. A low-noise output buffer circuit according to claim 3, wherein said second element is a resistor.

8. A low-noise output buffer circuit according to claim 3, wherein said second element is an NPN bipolar transistor.

9. A low-noise output buffer circuit according to claim 3, wherein said diode is a Schottky diode.

10. A low-noise output buffer circuit comprising:
    a resistor having a first end connected to a power source potential and a second end, said resistor for outputting the power source potential according to said second input signal;
    a MOSFET having a source connected to a ground potential, a gate for receiving said first input signal and a second input signal, and a drain, said MOSFET for outputting the ground potential according to said second input signal;
    a bipolar transistor having a collector connected to said power source potential, an emitter connected to an output terminal and a base connected to the second end of said resistor; and
    a diode having a cathode connected to the drain of said MOSFET and an anode connected to the base of said bipolar transistor.

11. A low-noise output buffer circuit comprising:
    a MOSFET having a source connected to a power source potential, a gate for receiving a first input signal and a second input signal, and a drain, said MOSFET for outputting the power source potential according to said first input signal;
    a resistor having a first end connected to a ground potential and a second end, said resistor for outputting the ground potential according to said second input signal;
    a bipolar transistor having a collector connected to said power source potential, an emitter connected to an output terminal and a base connected to the drain of said MOSFET; and
    a diode having a cathode connected to the second end of said resistor and an anode connected to the base of said bipolar transistor.

12. A low-noise output buffer circuit comprising:
    a first bipolar transistor having a collector connected to a power source potential, a base for receiving a first input signal and a second input signal, and an emitter, said first bipolar transistor for outputting the power source potential according to said first input signal;
    a resistor having a first end connected to a ground potential and a second end, said resistor for outputting the ground potential according to said second input signal;
    a second bipolar transistor having a collector connected to said power source potential, an emitter connected to an output terminal and a base connected to the emitter of said first bipolar transistor; and
    a diode having a cathode connected to the second end of said resistor and an anode connected to the base of said second bipolar transistor.

13. A low-noise output buffer circuit comprising:
    a resistor having a first end connected to a power source potential and a second end, said resistor for outputting the power source potential according to a first input signal;

a first bipolar transistor having an emitter connected to a ground potential, a base for receiving said first input signal and a second input signal, and a collector, said first bipolar transistor for outputting the ground potential according to said second input signal;

a second bipolar transistor having a collector connected to said power source potential, an emitter connected to an output terminal and a base connected to the second end of said resistor; and a diode having a cathode connected to the collector of said second bipolar transistor and an anode connected to the base of said first bipolar transistor.

* * * * *